United States Patent
Lee et al.

(10) Patent No.: US 6,381,165 B1
(45) Date of Patent: Apr. 30, 2002

(54) SEMICONDUCTOR MEMORY DEVICE HAVING STORAGE NODE ELECTRODES OFFSET FROM EACH OTHER

(75) Inventors: Jung-hyeon Lee; Han-ku Cho, both of Kyungki-do (KR)

(73) Assignee: Samsung Electronics Co., Ltd., Kyungki-Do (FR)

(*) Notice: Subject to any disclaimer, the term of this patent is extended or adjusted under 35 U.S.C. 154(b) by 0 days.

(21) Appl. No.: 09/966,785

(22) Filed: Sep. 28, 2001

(30) Foreign Application Priority Data

Apr. 4, 2001 (KR) .......................................... 2001-17947

(51) Int. Cl.⁷ ................................................ G11C 5/02

(52) U.S. Cl. ............................ 365/51; 365/149; 365/63; 257/296; 257/306; 257/311; 257/303; 257/304

(58) Field of Search ........................... 365/51, 63, 149; 257/68, 71, 296, 303, 304, 306, 309, 311

(56) References Cited

U.S. PATENT DOCUMENTS

| | | | | | |
|---|---|---|---|---|---|
| 5,740,115 A | * | 4/1998 | Ishibashi et al. | ............ | 365/203 |
| 5,851,873 A | * | 12/1998 | Murai et al. | ................. | 438/253 |
| 5,930,197 A | * | 7/1999 | Ishibashi et al. | ............ | 365/233 |
| 6,087,213 A | * | 7/2000 | Murai et al. | ................ | 438/238 |
| 6,140,684 A | * | 10/2000 | Chan et al. | ................. | 257/368 |
| 6,271,063 B1 | * | 8/2001 | Chan et al. | ................. | 438/153 |

* cited by examiner

Primary Examiner—Andrew Q. Tran
(74) Attorney, Agent, or Firm—F. Chau & Associates, LLP

(57) ABSTRACT

A semiconductor memory device that is capable of reducing the probability of a bridge being generated between storage node electrodes, and a mask pattern for defining the storage node electrodes, are provided. The semiconductor memory device includes a plurality of storage node electrodes that are vertically and horizontally arranged a predetermined distance apart in columns and rows, respectively. Among the plurality of storage node electrodes, storage node electrodes belonging to even-numbered columns are shifted up or down a predetermined distance. The shifted storage node electrodes are shifted in a gap between vertically adjacent storage node electrodes belonging to a same column.

9 Claims, 6 Drawing Sheets

SEMICONDUCTOR MEMORY DEVICE HAVING STORAGE NODE ELECTRODES OFFSET FROM EACH OTHER

BACKGROUND OF THE INVENTION

1. Technical Field

The present invention relates to a semiconductor memory device and a mask pattern for defining the same, and more particularly, to a storage node electrode array of a semiconductor memory device and a mask pattern for defining the same.

2. Description of Related Art

As the integration density of semiconductor devices increases, the area occupied by a unit active cell decreases. Since the driving capability of a memory device, such as a DRAM, is determined by the capacitance of a capacitor, various efforts have been made to increase the capacitance of a capacitor irrespective of the decrease in the area required for the capacitor. Up to now, a concave type storage electrode has been most widely used in order to the increase the effective size of the capacitor.

FIG. 1 is a plan view of a conventional concave type storage electrode. Referring to FIG. 1, a plurality of concave type storage node electrodes 12 are arranged on a semiconductor substrate 10 that includes a MOS transistor (not shown) and other electric plugs (not shown). In other words, the concave type storage node electrodes 12 are horizontally and vertically arranged a predetermined distance apart in a sort of matrix. Thus, the storage node electrodes 12 belonging to the same row are arranged in a straight line. Also, the storage node electrodes 12 belonging to the same column are arranged in a straight line. Each of the concave type storage electrodes 12 may be oval-shaped.

However, as the integration density of memory devices increases, the density of the storage node electrodes 12 of a semiconductor memory device increases. Accordingly, it is difficult to maintain sufficient gaps S1 and S2 between adjacent storage node electrodes 12. If the gaps S1 and S2 between adjacent storage node electrodes 12 are not sufficiently maintained, as illustrated in FIG. 1, a bridge 14 may be generated between the storage node electrodes 12 causing occurrences of electrical defects, such as a twin-bit fail or a multi-bit fail.

There are many reasons why a bridge 14 may form. However, hereinafter, only the physical and dynamic reasons for the generation of the bridge 14 will be described. Referring to FIG. 1, concave type storage node electrodes 12 are formed on the semiconductor substrate, and the resultant substrate is cleaned. In the cleaning process, a water screen (not shown) may be formed between the storage node electrodes 12 due to a rinse. Then, oxygen $O_2$ in the air easily dissolves in the water screen. The oxygen dissolved in the water screen forms a silicon oxide ($SiO_2$) layer on the surface of the storage node electrodes 12. The silicon oxide layer is dissolved into a type of silicate in the water screen between the storage node electrodes 12. After that, a drying process is performed. Then, the volume of the water screen between the storage node electrodes 12 decreases, and thus surface tension between the storage node electrodes 12 increases. As a result, solid type silicate 14 only remains in the water screen between the storage node electrodes 12, and the remaining silicate 14 becomes a bridge.

The reason for the occurrence of the bridge 14 will be described more fully with reference to Equation (1). In general, as shown in FIGS. 2a and 2b, the forces in action between the two adjacent storage node electrodes are surface tension (Fs), which is an attractive force, and a shear-and-bending force (Fe), which is a repulsive force. Assuming that the storage node electrode 12 has a hexagonal structure and is a rigid beam installed on a hard substrate, the shear-and-bending force Fe can be expressed by Equation (1).

$$Fe = \frac{3EIx}{H^3} \tag{1}$$

In Equation (1), E is Young's coefficient, that is, an elasticity coefficient of a material forming a storage node electrode, I is the inertial momentum of the horizontal cross-section of the storage node electrode 12, that is, the momentum for the storage node electrode 12 to continuously rotate in a spin dry process and is described as the elasticity of the storage node electrode 12 with respect to the thickness of the cylindrical storage node electrode 12, H is the height of the storage node electrode 12, and x is the distance by which the storage node electrode 12 is deformed. The deformation distance x is the distance between the original position of the upper part of the storage node electrode and the position of the upper part of the deformed storage node electrode.

The surface tension Fs between the storage node electrodes 12 is expressed by Equation (2).

$$Fs = 2\gamma \sin\theta(L+H) \tag{2}$$

In Equation (2), y indicates the surface tension coefficient of water, and θ indicates a contact angle which the storage node electrode 12 forms with water. L indicates the length of the storage node electrode 12, specifically, the opposing surface length of each of the two adjacent storage node electrodes.

In a state of equilibrium, the surface tension Fs and the shear-and-bending force Fe have the same strength. Thus, the deformation distance x of the storage node electrode 12 can be defined by Equation (3) obtained by combining Equation (1) and Equation (2).

$$x = \frac{2\gamma\sin\theta(L+H)H^3}{3EI} \tag{3}$$

According to Equation (3), the deformation distance x is proportional to the correspondence length L and the height H of the storage node electrode 12 but is inversely proportional to the elasticity coefficient E and the inertia momentum I of the storage node electrode 12.

Generally, the probability P of a bridge occurring between the storage node electrodes 12 is proportional to the deformation distance of each of the storage node electrodes 12 but is inversely proportional to the distance D between the storage node electrodes 12. Accordingly, these relations can be expressed by Equation (4) obtained by substituting the deformation distance x for the probability of bridge occurrence P in Equation (3).

$$P \propto \frac{2\gamma\sin\theta(L+H)H^3}{3EID} \tag{4}$$

As shown in Equation (4), as the distance D between the storage node electrodes 12 decreases, the height H of each of the storage node electrodes 12 increases, the opposing surface length L of each of the two horizontally-adjacent storage node electrodes 12 increases, and the bridge occurrence probability P increases.

However, to enhance the storage capacity of currently-used memory devices, a plurality of storage node electrodes must be integrated into a limited space and, simultaneously, the surface area of each of the storage node electrodes must be increased by increasing the height of each of the storage node electrodes. Thus, there is a limit to decreasing the distance between the storage node electrodes and the height and length of the storage node electrodes. Therefore, the probability of a bridge occurring becomes very high.

In addition, as shown in FIG. 3, to increase the surface area of each of the storage node electrodes 12 more, excessive light exposure must be performed to define the storage node electrodes 12. However, in this case, the storage node electrodes are defined to be larger than the desired storage node electrodes because of the excess exposure. Since the distance between the storage node electrodes 12 is very small, the adjacent storage node electrodes may contact together due to the excess exposure. Thus, it is difficult to perform an additional process to increase the surface area of the storage node electrodes 12. Reference numeral 15 of FIG. 3, which is not yet mentioned, indicates the increased area of an additionally expanded storage node electrode caused by excess exposure.

SUMMARY OF THE INVENTION

To solve the above and other related problems of the prior art, there is provided a semiconductor memory device having improved electrical characteristics. The semiconductor memory device according to the present invention is capable of reducing the probability of a bridge being generated between storage node electrodes.

According to an aspect of the present invention, there is provided a semiconductor memory device including a plurality of storage node electrodes that are vertically and horizontally arranged a predetermined distance apart in columns and rows, respectively. Among the plurality of storage node electrodes, storage node electrodes belonging to even-numbered columns are shifted up or down a predetermined distance.

According to another aspect of the present invention, the shifted storage node electrodes are shifted by a same distance.

According to yet another aspect of the present invention, the shifted storage node electrodes are shifted in a gap between vertically adjacent storage node electrodes belonging to a same column.

According to still another aspect of the present invention, the storage node electrodes are oval-shaped concave type storage node electrodes.

According to still yet another aspect of the present invention, there is provided a mask pattern for forming storage node electrodes. The mask pattern comprises a transparent substrate. A plurality of blocking layers are formed on the transparent substrate in rows and columns for defining shapes of the storage node electrodes. Among the plurality of blocking layers, blocking layers belonging to even-numbered columns are shifted up or down an equal distance.

According to a further aspect of the present invention, the shifted blocking layers are shifted in a gap between vertically adjacent blocking layers belonging to a same column.

According to a still further aspect of the present invention, the plurality of blocking layers are rectangular.

According to yet a still further aspect of the present invention, the mask pattern further comprises serifs for light compensation. The serifs are attached to at least one side of ends of the shifted blocking layers opposite to a direction in which the shifted blocking layers are shifted and to at least one side of ends of non-shifted blocking layers corresponding to the direction in which the shifted blocking layers are shifted.

BRIEF DESCRIPTION OF THE DRAWINGS

The advantages of the present invention will become more apparent by describing in detail a preferred embodiment thereof with reference to the attached drawings in which.

DETAILED DESCRIPTION OF THE INVENTION

Figure 1:
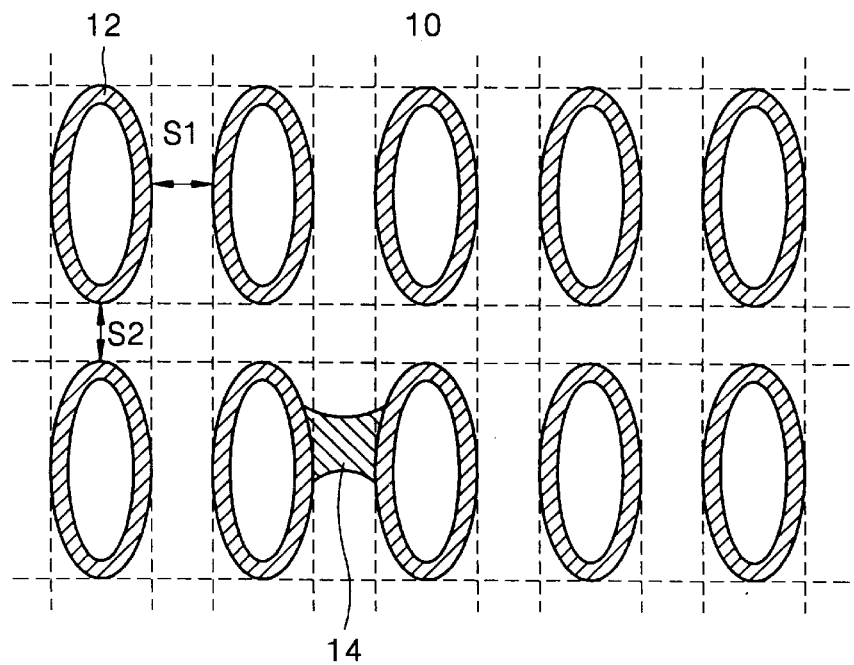
FIG. 1 is a diagram illustrating a plan view of a conventional concave type storage node electrode.
Figure 2A:
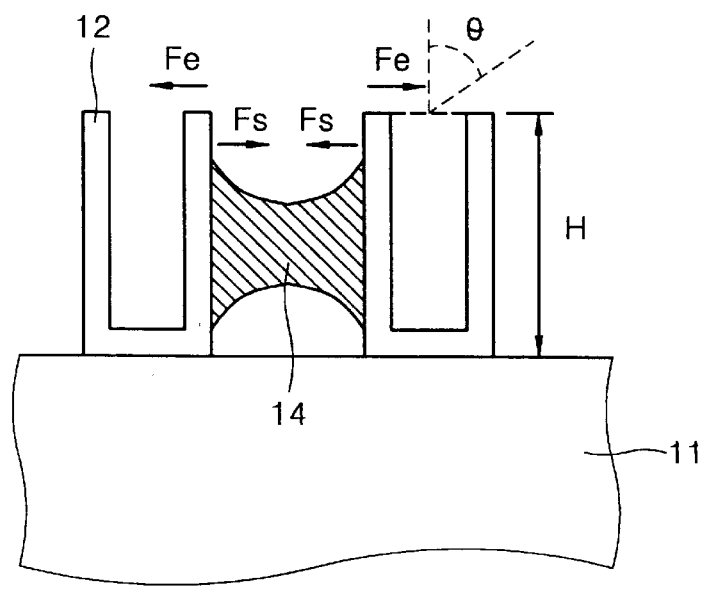
FIGS. 2A and 2B are diagrams illustrating a bridge occurrence between storage node electrodes.
Figure 2B:
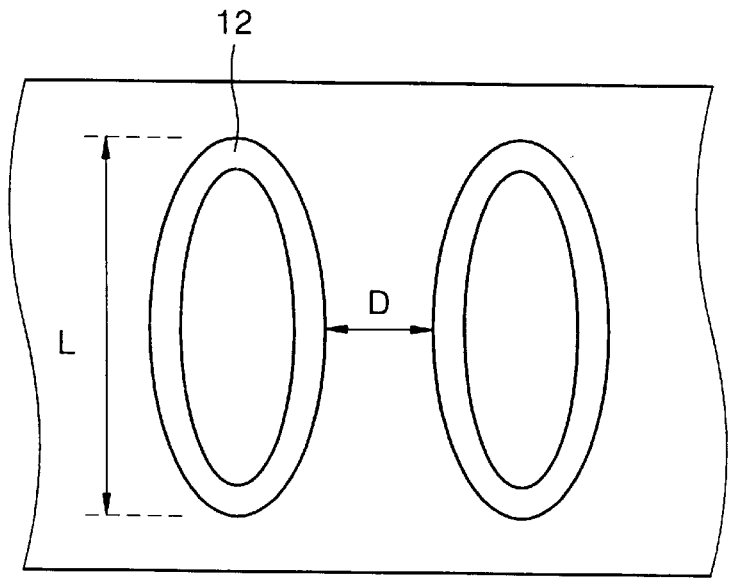
Figure 3:
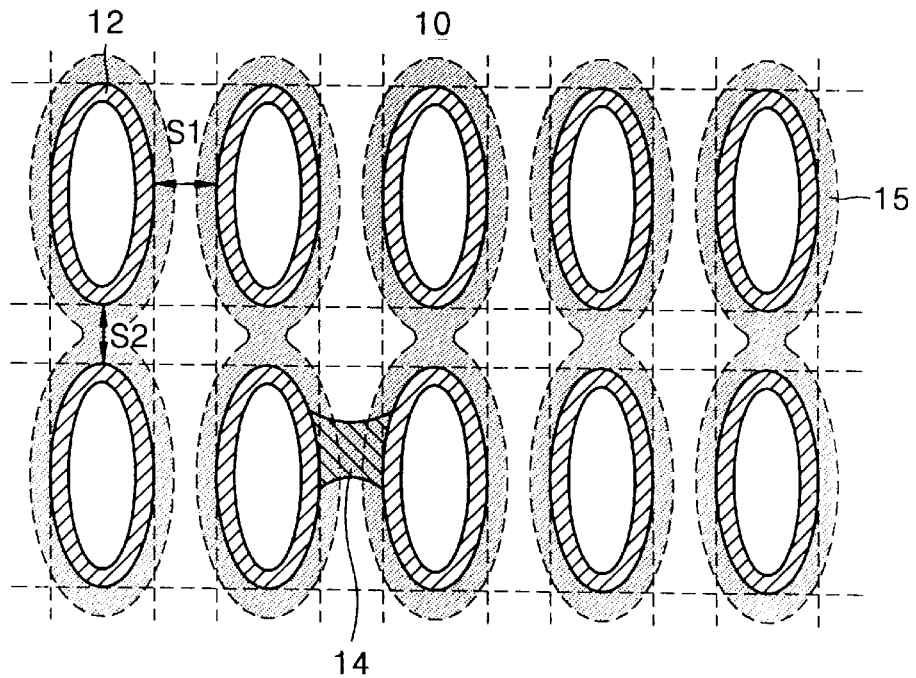
FIG. 3 is a diagram illustrating a plan view of a conventional concave type storage node electrode in the case of excess exposure.

The present invention will now be described more fully with reference to the accompanying drawings, in which a preferred embodiment of the invention is shown. This invention may, however, be embodied in many different forms and should not be construed as being limited to the embodiment set forth herein. Rather, this embodiment is provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present there between.

Figure 4:
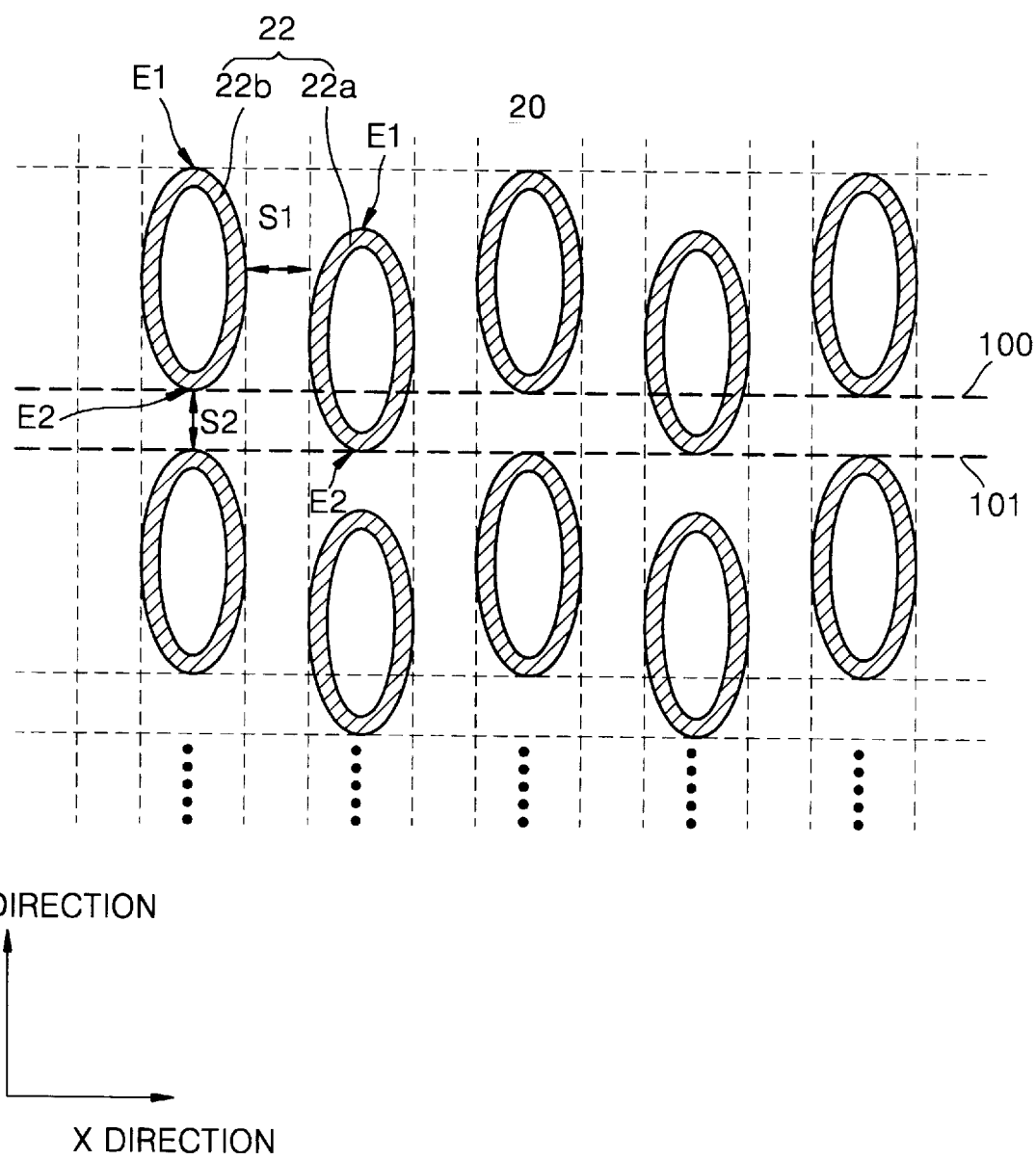
FIG. 4 is a diagram illustrating a plan view of a concave type storage node electrode according to an illustrative embodiment of the present invention.

Referring to FIG. 4, a semiconductor substrate 20 on which a plurality of MOS transistors (not shown), a plurality of electrical connection plugs (not shown) and an interlayer dielectric layer (not shown) are formed is prepared. A plurality of storage node electrodes 22 are arranged on the semiconductor substrate so as to be in contact with either the electrical connection plug (not shown) contacting the source region (not shown) of each of the MOS transistors (not shown) or the source region of each of the MOS transistors (not shown).

In the present embodiment, the storage node electrodes 22 are arranged in the following way to minimize the probability of a bridge being generated. The storage node electrodes 22 are arranged a predetermined distance apart in X and Y directions. In FIG. 4, S1 indicates the distance between adjacent storage node electrodes in the X direction, and S2 indicates the distance between adjacent storage node electrodes in the Y direction.

Storage node electrodes 22a belonging to even-numbered columns are shifted in the +Y direction or −Y direction a predetermined distance. The shifted storage node electrodes are referred to as 22a and the non-shifted storage node electrodes are referred to as 22b. The shifted storage node electrodes 22a are shifted the same distance. In the present embodiment, the storage node electrodes 22 belonging to even-numbered columns are shifted down a predetermined distance. Accordingly, the storage node electrodes 22a and 22b belonging to the same row do not stand in a straight line. In FIG. 4, reference numerals E1 and E2 indicate two end points of each of the storage node electrodes 22. The shifted storage node electrodes 22a are shifted a predetermined distance between the horizontal lines 100 and 101. In FIG. 4, the horizontal line 100 is drawn to connect the end points E2 of the non-shifted storage node electrodes 22b belonging to the same row, and the horizontal line 101 is drawn to connect the end points E2 of the shifted storage node electrodes 22a belonging to the same row and connect the end points E2 of the non-shifted storage node electrodes 22b belonging to the next row. In other words, the shifted storage node electrodes 22a are preferably shifted in a gap S2 between adjacent storage node electrodes 22 belonging to the same column. The storage node electrodes 22 of the present invention may be formed into oval-shaped concave type storage node electrodes so as to ensure high capacitance.

If the storage node electrodes 22 are arranged in such a way, the opposing surface area of each of the two adjacent storage node electrodes 22a and 22b belonging to the same row can be decreased irrespective of the arrangement of the storage node electrodes 22 in that the storage node electrodes 22 are separated from one another by the same distance as the prior art. Accordingly, the probability of a bridge being generated can be significantly reduced based on Equation (4).

Also, it is possible to shift the shifted storage node, electrodes 22a in the gap S2 between the adjacent storage node electrodes 22 belonging to the same column. Thus, in the case of using a line type storage node contact plug, the design of the storage node electrodes 22 does not have to be changed.

Figure 5:
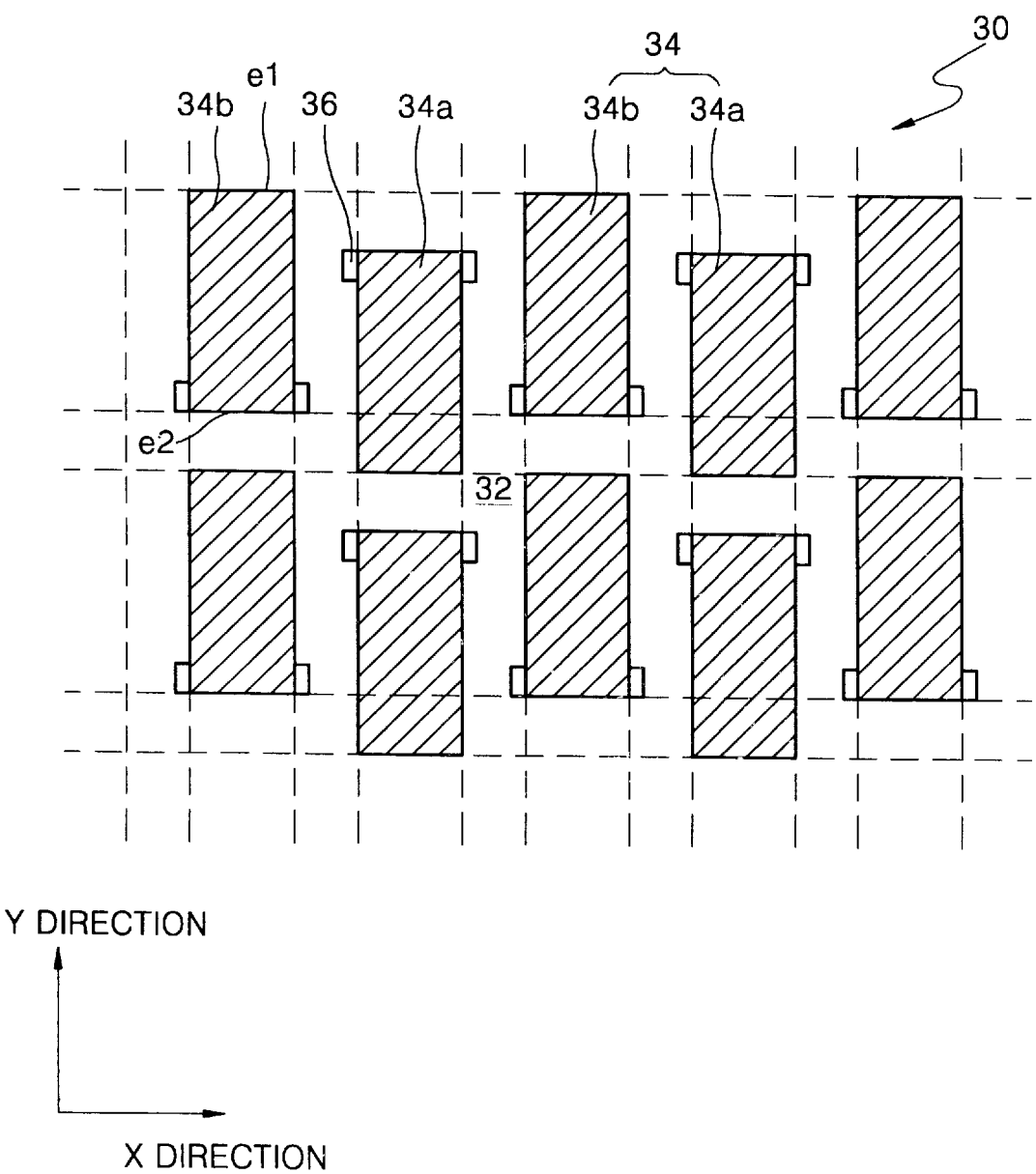
FIGS. 5 and 6 are diagrams illustrating plan views of a mask pattern for defining a storage node electrode according to an illustrative embodiment of the present invention.
Figure 6:
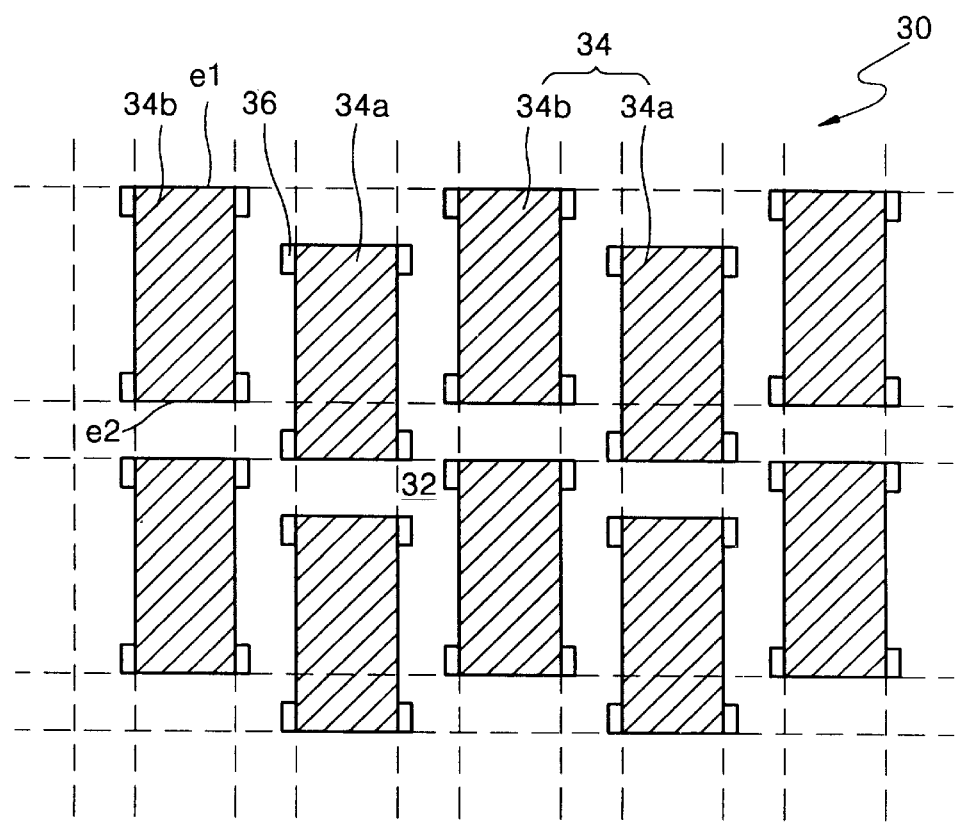

The storage node electrodes 22 of the present invention can be defined by a mask pattern 30, shown in FIGS. 5 and 6. As illustrated in FIGS. 5 and 6, the mask pattern 30 may include a transparent substrate, for example a quartz substrate 32, and blocking layers 34 which are arranged at desired positions so as to define the storage node electrodes 22 of FIG. 4.

The blocking layers 34 are arranged in the same way as the storage node electrodes 22. In other words, blocking layers 34a belong to even-numbered columns are shifted up (+Y direction) or down (-Y direction) by a predetermined length and, in the present embodiment, the shifted blocking layers 34a are shifted the same distance. Accordingly, the blocking layers 34 belonging to the same row do not stand in a straight line. Here, the shifted blocking layers are referred to as 34a and the non-shifted blocking layers are referred to as 34b. The blocking layers 34 may be rectangular. Even though the blocking layers 34 are rectangular, the storage node electrodes 22 of FIG. 4 are formed to be oval-shaped. Additionally, for optical proximity correction, serifs 36 may be attached to the blocking layers 34. As shown in FIG. 5, the serifs 36 are attached at either side of the ends of the shifted storage node electrodes 34a opposite to the direction in which the shifted storage node electrodes 34a are shifted and either side of the ends of the non-shifted storage node electrodes 34b corresponding to the direction in which the shifted storage node electrodes 34a are shifted. As shown in FIG. 6, the serifs 36 may be attached to every corner of the blocking layers 34. In FIGS. 5 and 6, reference numerals e1 and e2 indicate the upper and lower ends of each of the blocking layers 34, respectively.

Figure 7:
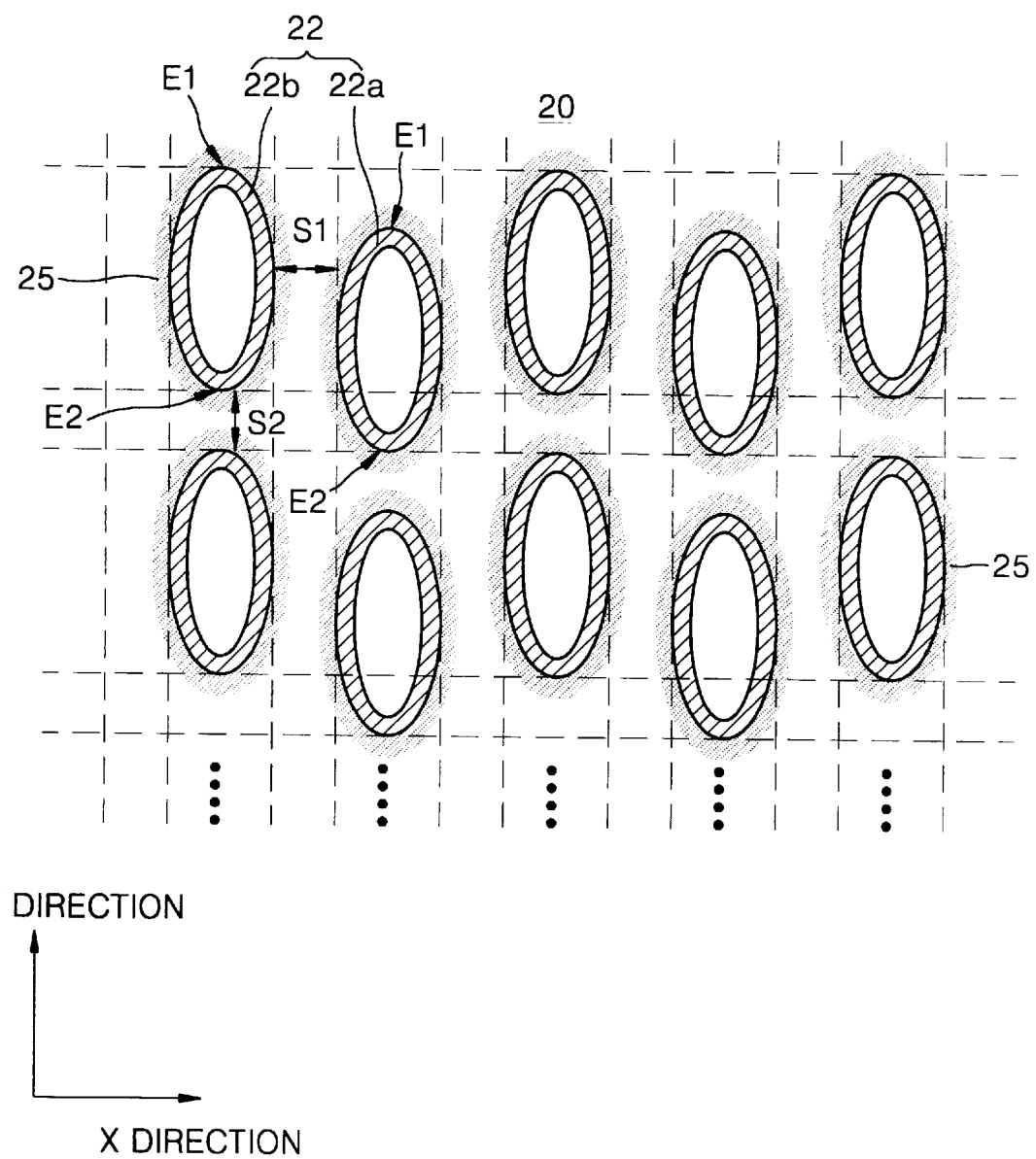
FIG. 7 is a diagram illustrating a plan view of a concave type storage node electrode according to an illustrative embodiment of the present invention.

If light-exposure is normally performed using the mask pattern 30, the storage node electrodes 22 of FIG. 4 are defined on the resultant semiconductor substrate 20. Also, to increase the surface area of each of the storage node electrodes, excess light-exposure can be performed using the mask pattern 30. At this time, even though light-exposure is excessive, the blocking layers 34 belonging to even-numbered columns are shifted up or down a predetermined distance, and thus constructive interference introduced by adjacent arrangement of the blocking layers 34 can be prevented. Accordingly, it is possible to increase the area of the storage node electrodes 22, while preventing the occurrence of a bridge. In FIG. 7, reference numeral 25, which has not yet been mentioned, indicates an increase in the area of each of the storage node electrodes 22 introduced by excess light-exposure.

In the present invention, it is possible to reduce the probability of a bridge being generated between storage node electrodes by changing the arrangement of the storage node electrodes within a range where the storage node electrodes are not affected by preceding and subsequent processes.

As described above, according to the present invention, storage node electrodes belonging to even-numbered columns among a plurality of storage node electrodes arranged on a semiconductor substrate are shifted up or down a predetermined distance. If the storage node electrodes are arranged in such a way, the opposing surface area of each of the two adjacent storage node electrodes belonging to the same row decreases, and thus the probability of a bridge being generated is reduced considerably. Accordingly, the electrical properties of a semiconductor memory device can be improved. In addition, the shifted storage node electrodes are shifted in a gap between the adjacent storage node electrodes belonging to the same column, and thus the design of the storage node electrodes does not have to be changed. Therefore, even though the arrangement of the storage node electrodes is changed, preceding and subsequent processes are not affected by the change in arrangement of the storage node electrodes, and thus additional expenses for changing the design of the storage node electrodes are not incurred.

Although the illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A semiconductor memory device including a plurality of storage node electrodes that are vertically and horizontally arranged a predetermined distance apart in columns and rows, respectively, wherein among the plurality of storage node electrodes, storage node electrodes belonging to even-numbered columns are shifted up or down a predetermined distance.

2. The semiconductor memory device of claim 1, wherein the shifted storage node electrodes are shifted by a same distance.

3. The semiconductor memory device of claim 1, wherein the shifted storage node electrodes are shifted in a gap between vertically adjacent storage node electrodes belonging to a same column.

4. The semiconductor memory device of claim 3, wherein the storage node electrodes are oval-shaped concave type storage node electrodes.

5. A semiconductor memory device, comprising:
- a plurality of storage node electrodes, arranged in rows and columns,
- wherein from among the plurality of storage node electrodes, one of at least two storage node electrodes that are adjacent in a same row are shifted up or down to reduce opposing surface areas of the at least two storage node electrodes.

6. The semiconductor memory device of claim 5, wherein the one of at least two storage node electrodes is shifted in a gap disposed between the one of at least two storage node electrodes and another storage node electrode that is vertically adjacent to the one of at least two storage node electrodes.

7. The semiconductor memory device of claim 5, wherein every alternating one of two horizontally adjacent storage node electrodes in the same row is shifted up or down to reduce opposing surface areas.

8. The semiconductor memory device of claim 7, wherein the every alternating one of two horizontally adjacent storage node electrodes is shifted up or down a predetermined distance.

9. The semiconductor memory device of claim 7, wherein the every alternating one of two horizontally adjacent storage node electrodes is shifted in a gap respectively disposed between the every alternating one of two horizontally adjacent storage node electrodes and other storage node electrodes that are respectively vertically adjacent to the every alternating one of two horizontally adjacent storage node electrodes.

* * * * *